United States Patent
Xue

(10) Patent No.: US 9,006,743 B2
(45) Date of Patent: Apr. 14, 2015

(54) THIN FILM TRANSISTOR, THIN FILM TRANSISTOR ARRAY SUBSTRATE, AND METHOD FOR MAKING THE SAME

(71) Applicant: Shenzhen China Star Optoelectronics Technology Co., Ltd., Shenzhen, Guangdong (CN)

(72) Inventor: Jingfeng Xue, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 13/985,603

(22) PCT Filed: Jun. 28, 2013

(86) PCT No.: PCT/CN2013/078364
§ 371 (c)(1),
(2) Date: Aug. 15, 2013

(87) PCT Pub. No.: WO2014/183328
PCT Pub. Date: Nov. 20, 2014

(65) Prior Publication Data
US 2014/0332817 A1   Nov. 13, 2014

(30) Foreign Application Priority Data
May 13, 2013 (CN) .......................... 2013 1 01760727

(51) Int. Cl.
H01L 29/786 (2006.01)
H01L 27/12 (2006.01)
H01L 29/66 (2006.01)
H01L 29/10 (2006.01)

(52) U.S. Cl.
CPC .......... *H01L 27/1222* (2013.01); *H01L 29/786* (2013.01); *H01L 29/66742* (2013.01); *H01L 29/1033* (2013.01)

(58) Field of Classification Search
CPC ............ H01L 27/1251; H01L 27/3262; H01L 29/4908; H01L 51/0508; H01L 2924/13069; H01L 2021/775; H01L 29/786
USPC .................. 257/E29.151, E51.005, E29.117, 257/E21.372, E27.1; 438/276, 149; 349/42, 349/139
See application file for complete search history.

(56) References Cited

U.S. PATENT DOCUMENTS

2003/0020106 A1* 1/2003 Tran .............................. 257/296
2013/0010247 A1* 1/2013 Wei et al. ...................... 349/139

* cited by examiner

*Primary Examiner* — Selim Ahmed
*Assistant Examiner* — Changhyun Yi
(74) *Attorney, Agent, or Firm* — Andrew C. Cheng

(57) ABSTRACT

The present invention provides a thin film transistor including a first drain electrode, a second drain electrode, a first source electrode, and a second source electrode, wherein the first drain electrode and the first source electrode jointly define a first U-shaped channel facing toward a first direction. Wherein the second drain electrode and the second source electrode jointly define a second U-shaped channel facing a second direction which is different to the first direction, wherein the bottom width of the second U-shaped channel is larger then the bottom width of the first U-shaped channel. The present invention further provides an array substrate of the thin film transistor, and a method for making the array substrate. By way of the forgoing, short-circuit between the source electrode and the drain electrode resulted from the cleaning agent residue located in the bottom of the U-shaped channel of the thin film transistor can be avoided.

9 Claims, 3 Drawing Sheets

THIN FILM TRANSISTOR, THIN FILM TRANSISTOR ARRAY SUBSTRATE, AND METHOD FOR MAKING THE SAME

FIELD OF THE INVENTION

The present invention relates to a technology field of liquid crystal display, and more particularly, to a thin film transistor, a thin film transistor array substrate and a method for making the same.

DESCRIPTION OF THE PRIOR ART

The thin film transistor liquid crystal display (TFT-LCD) has been developed in a fast pace, and the manufacturing the thin film transistor has become more and more mature.

Referring to FIG. 1, a configuration illustration of a prior art thin film transistor is shown. The existing thin film transistor includes a first U-shaped drain electrode 11, a second U-shaped drain electrode 12, a first strip-shaped source electrode 13, and a second strip-shaped source electrode 14. Wherein the first U-shaped drain electrode 11 and the first strip-shaped source electrode 13 jointly define a first U-shaped channel 15 having a width of D1, and the second U-shaped drain electrode 11 and the second strip-shaped source electrode 13 jointly define a second U-shaped channel 16 having a width of D2, wherein D1 equals to D2. However, in the existing manufacturing process of the thin film transistor, after the cleaning process, there are residues of cleaning agent deposited within the first U-shaped channel 15, and the second U-shaped channel 16. In order to remove those residues of cleaning agent, a blowing process will be conducted by a blowing apparatus so as to dry up the U-shaped channels 15, 16. However, since the first and second U-shaped channels 15, 16 are arranged opposite to each other, the blowing air can only blow away one of the first or second U-shaped channels 15, 16, depending on which one of the first and second U-shaped channels 15, 16 is facing against the blown air. If the first U-shaped channel 15 is facing the blowing air, then the cleaning agent residue will be dried up, while the second U-shaped channel 16 is still contaminated with the cleaning agent residue, since it is facing away from the blowing air. Referring to FIG. 2, which is a cross sectional view taken from line A-A' of FIG. 1. There is an ohmic contact layer 17 arranged under the first U-shaped drain electrode 11, the second U-shaped drain electrode 12, the first strip-shaped source electrode 13, and the second strip-shaped source electrode 14. As shown in FIG. 2, when the second U-shaped channel 16 is still contaminated with the cleaning agent residue, the ohmic contact layer 17 thereunder will be etched creating a short-circuit between the second U-shaped drain electrode 12 and the second strip-shaped source electrode 14.

Accordingly, there is a need for a thin film transistor, a thin film transistor array substrate and a method for making the same so as to resolve the technical issues encountered by the prior art.

SUMMARY OF THE INVENTION

The purpose of the present invention is to provide a thin film transistor, thin film transistor substrate, and a method for making the same so as to effectively overcome problem of the cleaning agent residue deposited within the U-shaped channel thereby preventing a short-circuit between the source electrode and the drain electrode resulted from the etching effect of the cleaning agent residue.

In order to resolve the technical problem encountered by the prior art, the present invention introduces a technical solution by providing a thin film transistor including a first drain electrode, a second drain electrode, a first source electrode, and a second source electrode, wherein the first drain electrode and the first source electrode jointly define a first U-shaped channel facing toward a first direction. Wherein the second drain electrode and the second source electrode jointly define a second U-shaped channel facing a second direction which is different to the first direction, wherein the bottom width of the second U-shaped channel is larger then the bottom width of the first U-shaped channel.

Wherein the difference between the bottom width of the second U-shaped channel and the bottom width of the first U-shaped channel ranges between 0.25 µm~1.25 µm.

Wherein the first drain electrode is a first U-shaped drain electrode, the second drain electrode is a second U-shaped drain electrode; wherein the first source electrode is a first strip-shaped source electrode, and the second source electrode is a second strip-shaped source electrode, wherein the first strip-shaped source electrode extends from an opening of the first U-shaped drain electrode to an internal side of the first U-shaped drain electrode and is separated with the first U-shaped drain electrode, wherein the second strip-shaped source electrode extends from an opening of the second U-shaped drain electrode to an internal side of the second U-shaped drain electrode and is separated with the second U-shaped drain electrode, wherein the bottom width of the first U-shaped channel equals to a width between an end of the first strip-shaped source electrode and a bottom of the first U-shaped drain electrode, and wherein the bottom width of the second U-shaped channel equals to a width between an end of the second strip-shaped source electrode and a bottom of the second U-shaped drain electrode.

Wherein the bottom of the first U-shaped drain electrode is partially overlapped with the bottom of the second U-shaped drain electrode.

Wherein the first direction is a direction of airflow which is used to dry up a cleaning agent during the cleaning process of the thin film transistor.

Wherein the first direction is opposite to the second direction.

Wherein the first drain electrode, the second drain electrode, the first source electrode, and the second source electrode are created by a same drain-source layer, wherein the thin film transistor further includes an ohmic contact layer located under the drain-source layer, wherein the ohmic contact layer is etched in an area corresponding to the first U-shaped channel and the second U-shaped channel so as to prevent a short-circuit generated between the first drain electrode and the first source electrode, and the second drain electrode and the second source electrode, respectively, resulted from in contact with the ohmic contact layer.

In order to resolve the technical problem encountered by the prior art, the present invention introduces a technical solution by providing an array substrate of a thin film transistor including an array substrate and a thin film transistor formed onto the array substrate, and the thin film transistor including a first drain electrode, a second drain electrode, a first source electrode, and a second source electrode. Wherein the first drain electrode and the first source electrode jointly define a first U-shaped channel facing toward a first direction, wherein the second drain electrode and the second source electrode jointly define a second U-shaped channel facing a second direction which is different to the first direction, wherein the bottom width of the second U-shaped channel is larger than the bottom width of the first U-shaped channel.

Wherein the difference between the bottom width of the second U-shaped channel and the bottom width of the first U-shaped channel ranges between 0.25 µm~1.25 µm.

Wherein the first drain electrode is a first U-shaped drain electrode, the second drain electrode is a second U-shaped drain electrode; wherein the first source electrode is a first strip-shaped source electrode, and the second source electrode is a second strip-shaped source electrode, wherein the first strip-shaped source electrode extends from an opening of the first U-shaped drain electrode to an internal side of the first U-shaped drain electrode and is separated with the first U-shaped drain electrode, wherein the second strip-shaped source electrode extends from an opening of the second U-shaped drain electrode to an internal side of the second U-shaped drain electrode and is separated with the second U-shaped drain electrode, wherein the bottom width of the first U-shaped channel equals to a width between an end of the first strip-shaped source electrode and a bottom of the first U-shaped drain electrode, and wherein the bottom width of the second U-shaped channel equals to a width between an end of the second strip-shaped source electrode and a bottom of the second U-shaped drain electrode.

Wherein the bottom of the first U-shaped drain electrode is partially overlapped with the bottom of the second U-shaped drain electrode.

Wherein the first direction is a direction of airflow which is used to dry up a cleaning agent during the cleaning process of the thin film transistor.

Wherein the first direction is opposite to the second direction.

Wherein the first drain electrode, the second drain electrode, the first source electrode, and the second source electrode are created by a same drain-source layer, wherein the thin film transistor further includes an ohm contact layer located under the drain-source layer, wherein the ohm contact layer is etched in an area corresponding to the first U-shaped channel and the second U-shaped channel so as to prevent a short-circuit generated between the first drain electrode and the first source electrode, and the second drain electrode and the second source electrode, respectively, resulted from in contact with the ohm contact layer.

In order to resolve the technical problem encountered by the prior art, the present invention introduces a technical solution by providing a method for making array substrate of thin film transistor, comprising the steps of: 1) forming a drain-source layer over a substrate; 2) conducting an etching process in the drain-source layer so as to create a first drain electrode, a second drain electrode, a first source electrode, and a second source electrode, wherein the first drain electrode and the first source electrode jointly define a first U-shaped channel facing toward a first direction, wherein the second drain electrode and the second source electrode jointly define a second U-shaped channel facing a second direction which is different to the first direction, wherein the bottom width of the second U-shaped channel is larger than the bottom width of the first U-shaped channel; 3) conducting a cleaning process to the substrate with a cleaning agent; and 4) drying up the cleaning agent with blowing airflow along the first direction.

Wherein before the step 1) of forming the drain-source layer over the substrate, further includes the step 5) of forming an ohmic contact layer located under the drain-source layer; wherein after the step 4) of drying up the cleaning agent, further comprising the step 6) of etching the ohmic contact layer in an area corresponding to the first U-shaped channel and the second U-shaped channel so as to prevent a short-circuit generated between the first drain electrode and the first source electrode, and the second drain electrode and the second source electrode, respectively, resulted from in contact with the ohmic contact layer.

The present invention can be concluded with the following advantages. As compared to the existing prior art, by setting and arranging the bottom width of the second U-shaped channel be larger than the bottom width of the first U-shaped channel, the ohm contact layer located under the second U-shaped channel can be readily etched when there is cleaning agent residue in the bottom of the second U-shaped channel. By this arrangement, the short-circuit between the second drain electrode and the second source electrode can be readily prevented. Accordingly, the short-circuit between the source electrode and the drain electrode of the thin film transistor can be prevented.

BRIEF DESCRIPTION OF PREFERRED EMBODIMENT

Figure 7:
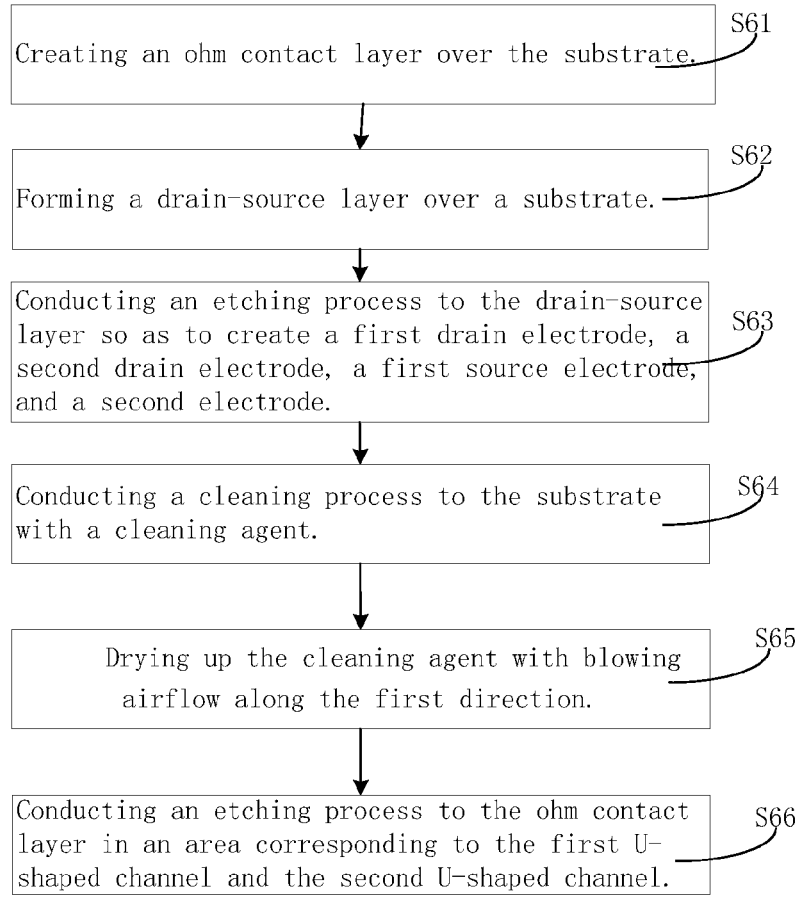
Figure 8:
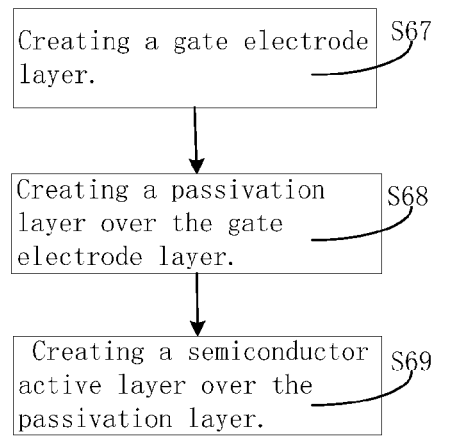

FIG. 7 is a flow-chart diagram illustrating a method for making the array substrate of the thin film transistor made in accordance with a first embodiment of the present invention; and FIG. 8 is a flow-chart diagram illustrating a method for making the array substrate of the thin film transistor made in accordance with a second embodiment of the present invention and in which only steps in additional to the first embodiment of method have been disclosed.

DETAILED DESCRIPTION OF PREFERRED EMBODIMENTS

Detailed description will be given in view of the preferred embodiments as well as the accompanied drawings.

Figure 1:
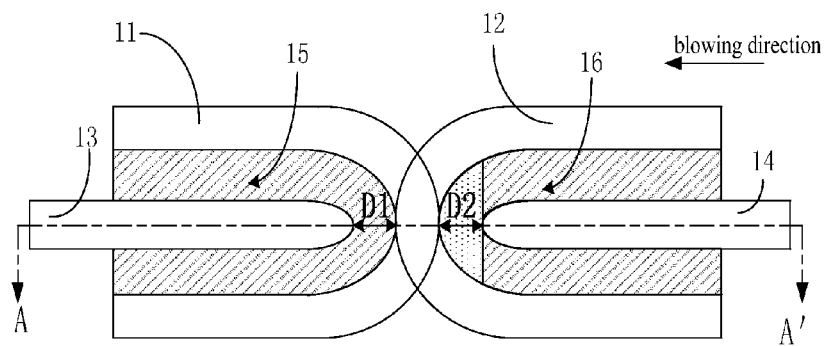
FIG. 1 is a configurational illustration of a prior art thin film transistor.
Figure 2:
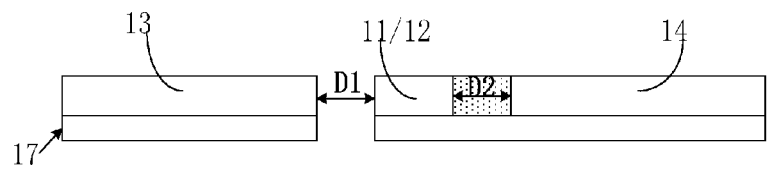
FIG. 2 is a cross-sectional view taken from line A-A' of FIG. 1.
Figure 3:
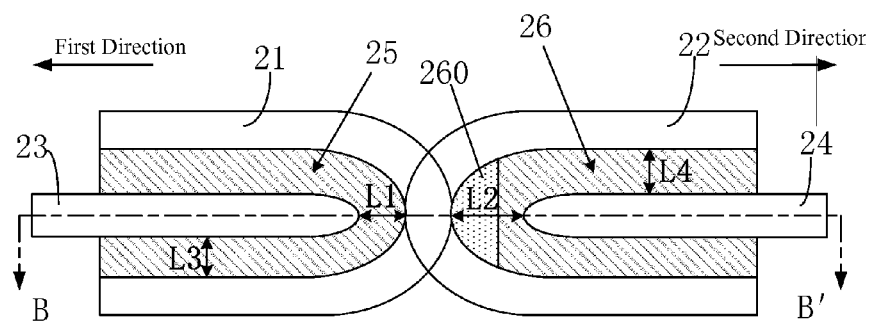
FIG. 3 is a configurational illustration of a thin film transistor made in accordance with a first preferred embodiment of the present invention.
Figure 4:
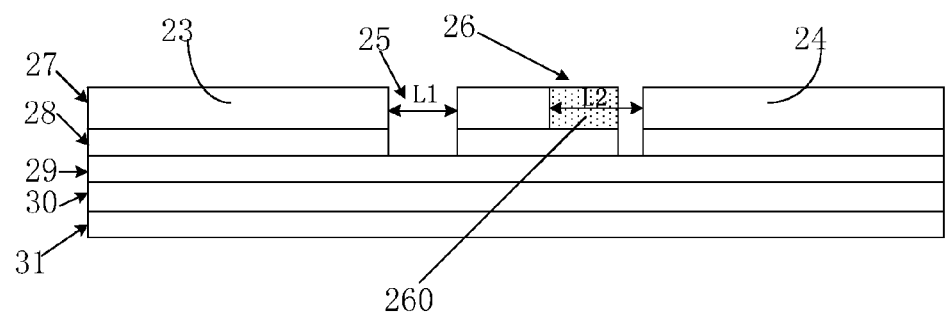
FIG. 4 is a cross-sectional view taken from line B-B' of FIG. 3

Referring to FIGS. 3 and 4, in which FIG. 3 is a configurational illustration of a thin film transistor made in accordance with a first preferred embodiment of the present invention; and FIG. 4 is a cross-sectional view taken from line B-B' of FIG. 3. In the current embodiment, the thin film transistor preferably includes a first drain electrode 21, a second drain electrode 22, a first source electrode 23, a second source electrode 24, an ohmic contact layer 28, a semiconductor active layer 29, a passivation layer 30, and a gate electrode layer 31. The first drain electrode 21, the second drain electrode 22, the first source electrode 23, and the second source electrode 28 are all made from the common drain-source layer 27. The ohmic contact layer 28 is located under the drain-source layer 27. The semiconductor layer 29, the passivation layer 30, and the gate electrode layer 31 are arranged under the ohmic contact layer 28 in sequence, i.e. the gate electrode layer 31, the passivation layer 30, the semiconductor active layer 29, the ohmic contact layer 28 and the drain-source layer 27 are all stacked together. In the current embodiment, the semiconductor active layer 29 is preferably amorphous silicon, and the passivation layer 30 is silicon nitride layer. In other preferred embodiment, the semiconductor active layer 29 and the passivation layer 30 can be made from other suitable material. On the other hand, the layers disclosed above can also be arranged in other proper materials.

The first drain electrode 21 and the first source electrode 23 jointly define the first. U-shaped channel 25 with the opening facing toward a first direction. The second drain electrode 22 and the second source electrode 24 jointly define the second U-shaped channel 26 with the opening facing toward a second direction which is different to the first direction. Substantially, in the current embodiment, the first drain electrode 21 is preferably embodied as a first U-shaped drain electrode 21, the second drain electrode 22 is preferably embodied with a second U-shaped drain electrode 22. Both the first and second drain electrodes 21, 22 have the U-shaped configuration. The first source electrode 23 is preferably embodied as a first strip-shaped electrode 23, and the second source electrode 24 is preferably embodied as a second strip-shaped electrode 24. Both the first and second source electrodes 23, 24 are strip-shaped configuration. The first strip-shaped electrode 23 extends from an opening of the first U-shaped drain electrode 21 to the internal side of the first U-shaped drain electrode 21, and is further separated to the first U-shaped drain electrode 21. As a result, a first U-shaped channel 25 is created in the separation zone. The second strip-shaped electrode 24 extends from an opening of the second U-shaped drain electrode 22 to the internal side of the second U-shaped drain electrode 22, and is further separated to the second U-shaped drain electrode 22. As a result, a second U-shaped channel 26 is created in the separation zone. In the current embodiment, the bottom of the first U-shaped drain electrode 21 and the bottom of the second U-shaped drain electrode 22 are partially overlapped. In the current embodiment, the first direction and the second direction are opposite to each other, i.e. the direction of the opening of the first U-shaped channel 25 is opposite to the direction of the opening of the second U-shaped channel 26. The opening of the first U-shaped drain electrode 21 is opposite to the opening of the second U-shaped drain electrode 22. In the present embodiment, the first direction is preferably the blowing direction of airflow during the drying process of a cleaning agent to the thin film transistor. In other preferred embodiment, the first and second directions can be arranged with other feasible manse In the current embodiment, the first U-shaped channel 25 and the second U-shaped channel 26 each includes a curve bottom and two linear sides. The bottom width L2 of the second U-shaped channel 26 is larger than the bottom width L1 of the first U-shaped channel 25. Wherein the bottom width L1 of the first U-shaped channel 25 equals to a distance between an end of the first strip-shaped source electrode 23 and the bottom of the first U-shaped drain electrode 21; the bottom width L2 of the second U-shaped channel 26 equals to a distance between an end of the second strip-shaped source electrode 24 and the bottom of the second U-shaped drain electrode 22. In the current embodiment, the difference between the bottom width L2 of the second U-shaped channel 26 and the bottom width L1 of the first U-shaped channel 25 is preferably ranges from 0.25 µm~1.25 µm. In other preferred embodiment, the difference of the bottom width L1 and L2 of the first and second U-shaped channels 25, 26 can be other suitable values.

Referring now to FIGS. 3 and 4, during the manufacturing of the thin film transistor, the ohmic contact layer 28 will be etched in an area corresponding to the first U-shaped channel 25, and the second U-shaped channel 26 so as to prevent a short-circuit occurred between the first drain electrode 21 and the first source electrode 23, and the second drain electrode 22 and the second source electrode 24 through the ohmic contact layer 28. Since the first direction is the blowing direction of airflow to dry up the cleaning agent during the cleaning process of the thin film transistor, accordingly, only the cleaning agent residue in the first U-shaped channel 25 will be dried up because the opening of the first U-shaped channel 25 faces the first direction, while the cleaning agent residue 260 in the second U-shaped channel 26 will be there still. During the etching process, the area of the ohmic contact layer 28 corresponding to the first U-shaped channel 25 will be completely etched out, cutting off the ohmic contact layer 28 interconnecting the first drain electrode 21 and the first source electrode 23. However, since there is still cleaning agent residue 260 remains in the second U-shaped channel 26, accordingly, the area of the ohmic contact layer 28 under the cleaning agent 260 will not be etched out. However, since the bottom width L2 of the second U-shaped channel 26 made in accordance with the present embodiment has been increased, as a result, the ohmic contact layer 28 which is not covered by the cleaning agent 260 will still be etched out. Accordingly, the short-circuit between the second drain electrode 22 and the second source electrode 24 because of the interconnection of the ohmic contact layer 28 can be still avoided. By this, the short-circuit between the source electrode and the drain electrode of the thin film transistor can be prevented.

Furthermore, in the current embodiment, the bottom width L1 of the first U-shaped channel 25 can be preferably set to equal to the width L3 of its side, while the bottom width L2 of the second U-shaped channel 26 is preferably set to larger than the width L4 of its side. Preferably, the width L4 of the side is set to equal to the width L3 of the side of the first U-shaped channel 25. In the current embodiment, the difference between the bottom width L2 of the second U-shaped channel 26 and the width L4 of the side ranges from 0.25 µm~1.25 µm. In other alternative embodiment, the bottom width L2 of the second U-shaped channel 26 can be smaller or equal to the width L4 of the side, and the difference between the bottom width L2 of the second U-shaped channel 26 and the width L4 of the side can be other values.

Figure 5:
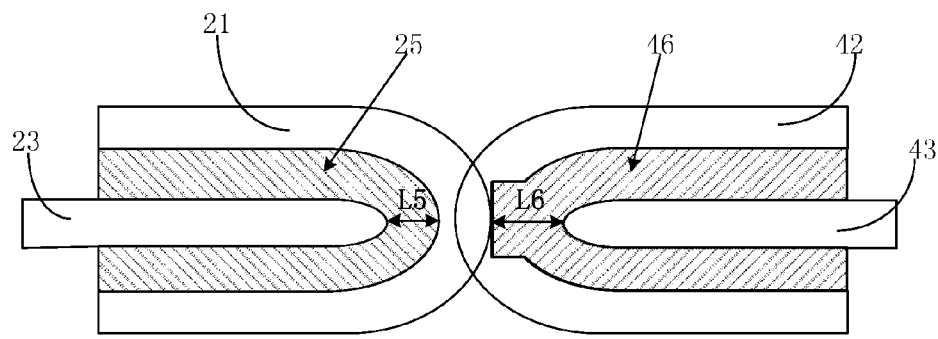
FIG. 5 is a configurational illustration of a thin film transistor made in accordance with a second preferred embodiment of the present invention.

It should be noted that in the current embodiment, the bottom of the second U-shaped channel 26 is a regular arc shape, while in other alternative embodiment, the bottom of the second U-shaped channel 26 can be other shape, such as shown in FIG. 5, which is a configurational illustration of a thin film transistor made in accordance with a second preferred embodiment of the present invention. In the current embodiment, the first drain electrode 21, the first source electrode 23, and the first U-shaped channel 25 are exactly the first drain electrode 21, the first source electrode 23, and the first U-shaped channel 25 in the first embodiment, and therefore no further description is given. Wherein the bottom width of the first U-shaped channel 25 is L5. A second U-shaped channel 46 is generated between the second drain electrode 42 and the second source electrode 43. The bottom of the second drain electrode 42 is recessed inwardly such that the bottom width L6 of the second U-shaped channel 46 is increased. The value of the L6 is larger than the bottom width L5 of the first U-shaped channel 25.

Figure 6:
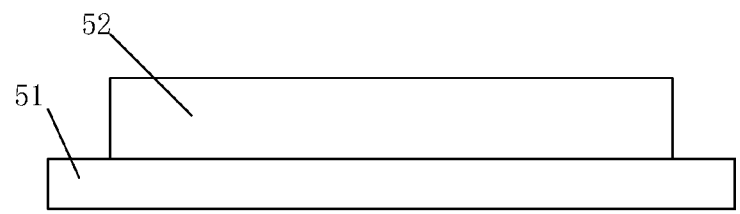
FIG. 6 is a configurational illustration of an array substrate of the thin film transistor made in accordance with the present invention.

FIG. 6 is a configurational illustration of an array substrate of the thin film transistor made in accordance with the present invention. In the current embodiment, the array substrate of the thin film transistor includes a substrate 51 and a thin film transistor 52. The thin film transistor 52 is disposed onto the substrate 51. The thin film transistor 52 can be any thin film transistor made from the embodiments described above.

FIG. 7 is a flow-chart diagram illustrating a method for making the array substrate of the thin film transistor made in accordance with a first embodiment of the present invention. In the current embodiment, the method for making array substrate of thin film transistor comprises the steps.

Step S61: creating an ohm contact layer over the substrate.

Step S62: forming a drain-source layer over a substrate

In the above-described steps S61 and S62, the ohm contact layer is created firstly over the substrate, and then the drain-source layer is deposited over the ohm contact layer. It should be readily understood that other suitable and necessary layer can be readily deposited before the deposition of the ohm contact layer.

Step S63: conducting an etching process to the drain-source layer so as to create a first drain electrode, a second drain electrode, a first source electrode, and a second electrode.

In the step S63, wherein the first drain electrode and the first source electrode jointly define a first U-shaped channel facing toward a first direction, wherein the second drain electrode and the second source electrode jointly define a second U-shaped channel facing a second direction which is different to the first direction, wherein the bottom width of the second U-shaped channel is larger then the bottom width of the first U-shaped channel. The first direction is opposite to the second direction. However, in other preferred embodiment, the first and second directions can be other directions which are not opposite to each other.

Step S64: conducting a cleaning process to the substrate with a cleaning agent.

Step S65: drying up the cleaning agent with blowing airflow along the first direction.

Step S66: conducting an etching process to the ohm contact layer in an area corresponding to the first U-shaped channel and the second U-shaped channel.

In step S66, conducting an etching process to the ohm contact layer in an area corresponding to the first U-shaped channel and the second U-shaped channel is to prevent a short-circuit happened between the first drain electrode and the first source electrode, and the second drain electrode and the second source electrode through the ohm contact layer.

It should be noted that in other preferred embodiment, in the step S61 conducted during the method of making the array substrate of the thin film transistor, the ohm contact layer can also be other layer to be removed through etching process.

FIG. 8 is a flow-chart diagram illustrating a method for making the array substrate of the thin film transistor made in accordance with a second embodiment of the present invention and in which only steps in additional to the first embodiment of method have been disclosed. According to a second embodiment of the method for making the array substrate of the thin film transistor, additional steps have been included before conducting the step of S61 made in according to the first embodiment of the present invention for making the array substrate of thin film transistor. The additional steps include the following.

Step S67: creating a gate electrode layer.

Step S68: creating a passivation layer over the gate electrode layer.

In step S68, the passivation layer is silicon nitride. However, in other preferred embodiment, the passivation layer can be other suitable material.

Step S69: creating a semiconductor active layer over the passivation layer.

In step S69, the semiconductor active layer is amorphous silicon layer. However, in other preferred embodiment, the semiconductor active layer can be made from other proper materials.

In other preferred embodiment, the sequence of the steps S67, S68 and S69 can be performed with other suitable order.

As compared to the existing prior art, by setting and arranging the bottom width of the second U-shaped channel be larger than the bottom width of the first U-shaped channel, the ohm contact layer located under the second U-shaped channel can be readily etched when there is cleaning agent residue in the bottom of the second U-shaped channel. By this arrangement, the short-circuit between the second drain electrode and the second source electrode can be readily prevented. Accordingly, the short-circuit between the source electrode and the drain electrode of the thin film transistor can be prevented.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

The invention claimed is:

1. A thin film transistor including a first drain electrode, a second drain electrode, a first source electrode, and a second source electrode, wherein the first drain electrode and the first source electrode jointly define a first U-shaped channel facing toward a first direction, wherein the second drain electrode and the second source electrode jointly define a second U-shaped channel facing a second direction which is opposite to the first direction, wherein the bottom width of the second U-shaped channel is larger then the bottom width of the first U-shaped channel; and wherein the difference between the bottom width of the second U-shaped channel and the bottom width of the first U-shaped channel ranges between 0.25 µm~1.25 µm; and wherein the bottom of the first U-shaped drain electrode is partially overlapped with the bottom of the second U-shaped drain electrode.

2. The thin film transistor as recited in claim 1, wherein the first drain electrode is a first U-shaped drain electrode, the second drain electrode is a second U-shaped drain electrode; wherein the first source electrode is a first strip-shaped source electrode, and the second source electrode is a second strip-shaped source electrode, wherein the first strip-shaped source electrode extends from an opening of the first U-shaped drain electrode to an internal side of the first U-shaped drain electrode and is separated with the first U-shaped drain electrode, wherein the second strip-shaped source electrode extends from an opening of the second U-shaped drain electrode to an internal side of the second U-shaped drain electrode and is separated with the second U-shaped drain electrode, wherein the bottom width of the first U-shaped channel equals to a width between an end of the first strip-shaped source electrode and a bottom of the first U-shaped drain electrode, and wherein the bottom width of the second U-shaped channel equals to a width between an end of the second strip-shaped source electrode and a bottom of the second U-shaped drain electrode.

3. The thin film transistor as recited in claim 2, wherein the bottom of the first U-shaped drain electrode is partially overlapped with the bottom of the second U-shaped drain electrode.

4. The thin film transistor as recited in claim 1, wherein the first direction is a direction of airflow which is used to dry up a cleaning agent during the cleaning process of the thin film transistor.

5. The thin film transistor as recited in claim 1, wherein the first drain electrode, the second drain electrode, the first source electrode, and the second source electrode are created by a same drain-source layer, wherein the thin film transistor further includes an ohmic contact layer located under the drain-source layer, wherein the ohmic contact layer is etched in an area corresponding to the first U-shaped channel and the second U-shaped channel so as to prevent a short-circuit generated between the first drain electrode and the first source electrode, and the second drain electrode and the second source electrode, respectively, resulted from in contact with the ohmic contact layer.

6. An array substrate of a thin film transistor including an array substrate and a thin film transistor formed onto the array substrate, and the thin film transistor including a first drain electrode, a second drain electrode, a first source electrode, and a second source electrode, wherein the first drain electrode and the first source electrode jointly define a first U-shaped channel facing toward a first direction, wherein the second drain electrode and the second source electrode jointly define a second U-shaped channel facing a second direction which is opposite to the first direction, wherein the bottom width of the second U-shaped channel is larger then the bottom width of the first U-shaped channel;

wherein the difference between the bottom width of the second U-shaped channel and the bottom width of the first U-shaped channel ranges between 0.25 μm~1.25 μm; and wherein the bottom of the first U-shaped drain electrode is partially overlapped with the bottom of the second U-shaped drain electrode.

7. The array substrate of thin film transistor as recited in claim 6, wherein the first drain electrode is a first U-shaped drain electrode, the second drain electrode is a second U-shaped drain electrode; wherein the first source electrode is a first strip-shaped source electrode, and the second source electrode is a second strip-shaped source electrode, wherein the first strip-shaped source electrode extends from an opening of the first U-shaped drain electrode to an internal side of the first U-shaped drain electrode and is separated with the first U-shaped drain electrode, wherein the second strip-shaped source electrode extends from an opening of the second U-shaped drain electrode to an internal side of the second U-shaped drain electrode and is separated with the second U-shaped drain electrode, wherein the bottom width of the first U-shaped channel equals to a width between an end of the first strip-shaped source electrode and a bottom of the first U-shaped drain electrode, and wherein the bottom width of the second U-shaped channel equals to a width between an end of the second strip-shaped source electrode and a bottom of the second U-shaped drain electrode.

8. The array substrate of thin film transistor as recited in claim 6, wherein the first direction is a direction of airflow which is used to dry up a cleaning agent during the cleaning process of the thin film transistor.

9. The array substrate of thin film transistor as recited in claim 6, wherein the first drain electrode, the second drain electrode, the first source electrode, and the second source electrode are created by a same drain-source layer, wherein the thin film transistor further includes an ohmic contact layer located under the drain-source layer, wherein the ohmic contact layer is etched in an area corresponding to the first U-shaped channel and the second U-shaped channel so as to prevent a short-circuit generated between the first drain electrode and the first source electrode, and the second drain electrode and the second source electrode, respectively, resulted from in contact with the ohmic contact layer.

\* \* \* \* \*